(12) United States Patent
Thiagarajan et al.

(10) Patent No.: US 7,679,422 B1
(45) Date of Patent: Mar. 16, 2010

(54) CONFIGURABLE SWITCHED CAPACITOR BLOCK

(75) Inventors: Eashwar Thiagarajan, Bothell, WA (US); Harold Kutz, Edmonds, WA (US)

(73) Assignee: Cypress Semiconductor Corporation, San Jose, CA (US)

( * ) Notice: Subject to any disclaimer, the term of this patent is extended or adjusted under 35 U.S.C. 154(b) by 21 days.

(21) Appl. No.: 11/704,589

(22) Filed: Feb. 8, 2007

Related U.S. Application Data

(60) Provisional application No. 60/772,422, filed on Feb. 9, 2006.

(51) Int. Cl.
*G06F 7/64* (2006.01)
*G06G 7/18* (2006.01)
*G06G 7/19* (2006.01)

(52) U.S. Cl. .................. 327/337; 341/143; 341/155
(58) Field of Classification Search .......... 327/337
See application file for complete search history.

(56) References Cited

U.S. PATENT DOCUMENTS

| | | | | |
|---|---|---|---|---|
| 4,988,900 A | * | 1/1991 | Fensch | 327/337 |
| 5,150,120 A | | 9/1992 | Yunus | |
| 5,973,536 A | * | 10/1999 | Maejima | 327/337 |
| 6,040,793 A | * | 3/2000 | Ferguson et al. | 341/143 |
| 6,744,394 B2 | * | 6/2004 | Liu et al. | 341/155 |
| 7,138,932 B1 | | 11/2006 | Chen | |
| 7,479,913 B1 | | 1/2009 | Thiagarajan et al. | |

OTHER PUBLICATIONS

U.S. Appl. No. 11/703,873: "Configurable Analog to Digital Converter," Thiagarajan et al., filed on Feb. 7, 2007; 29 pages.
USPTO Notice of Allowance for U.S. Appl. No. 11/703,873 dated Sep. 26, 2008; 7 pages.
USPTO Non-Final Rejection for U.S. Appl. No. 11/703,873 dated May 13, 2008; 10 pages.

* cited by examiner

*Primary Examiner*—Lincoln Donovan
*Assistant Examiner*—John W Poos

(57) ABSTRACT

A configurable switched capacitor block includes a switched-capacitor (SC) sampling circuit, a fully differential amplifier, an SC feedback circuit, and a comparator. The SC sampling circuit is coupled to receive an input signal and to selectively generate a sampled signal to a differential input of the amplifier. The SC feedback circuit is coupled between the differential inputs and the differential outputs of the amplifier to selectively control a feedback of the amplifier. The comparator is coupled to the differential outputs of the amplifier to generate an output signal. The configurable switched capacitor block has multiple modes of operation which are selectable by programming the SC sampling circuit and the SC feedback circuit.

14 Claims, 6 Drawing Sheets

US 7,679,422 B1

CONFIGURABLE SWITCHED CAPACITOR BLOCK

CROSS-REFERENCE TO RELATED APPLICATION

This application claims the benefit of U.S. Provisional Application No. 60/772,422, filed Feb. 9, 2006, hereby incorporated by reference.

TECHNICAL FIELD

This disclosure relates generally to electronic circuits, and in particular but not exclusively, relates to switched capacitor circuits.

BACKGROUND INFORMATION

An analog-to-digital converter (ADC) converts an analog signal (e.g., voltage level) into a corresponding digital signal (binary word). There are numerous ways to implement an ADC. A conventional type of ADC is an incremental converter. An incremental converter utilizes an integrator and comparator and a pair of references. The input is integrated on one phase of the clock cycle. The reference is then integrated in the opposite direction in the second phase of the clock cycle. The reference selection, positive or negative, is driven by the comparator, always integrating back to zero. The number of cycles in which the comparator output is positive is counted to obtain the digital result. The incremental ADC makes $2^n$ comparisons to form an n-bit conversion.

Yet another conventional type of ADC is a delta sigma ADC. The delta sigma ADC utilizes the same integrator/comparator topology. Rather than integrating the comparator output in a counter, the comparator result is processed in a decimator.

Such conventional ADCs utilize a fixed architecture. That is, a conventional ADC is not reconfigurable after fabrication. For example, conventional ADCs include fixed architecture integrators, fixed architecture amplifiers, or fixed architecture comparators, and are not reconfigurable to implement all three functions: integrator, amplifier, and comparator. That is, the same circuit element cannot be reused to implement the above listed three different functions. Such conventional ADCs suffer from pre-selected tradeoffs made during fabrication. In addition, conventional ADCs utilize single ended switched capacitor circuits.

BRIEF DESCRIPTION OF THE DRAWINGS

Non-limiting and non-exhaustive embodiments of the invention are described with reference to the following figures, wherein like reference numerals refer to like parts throughout the various views unless otherwise specified.

DETAILED DESCRIPTION

Embodiments of a configurable switched capacitor block are described herein. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1:
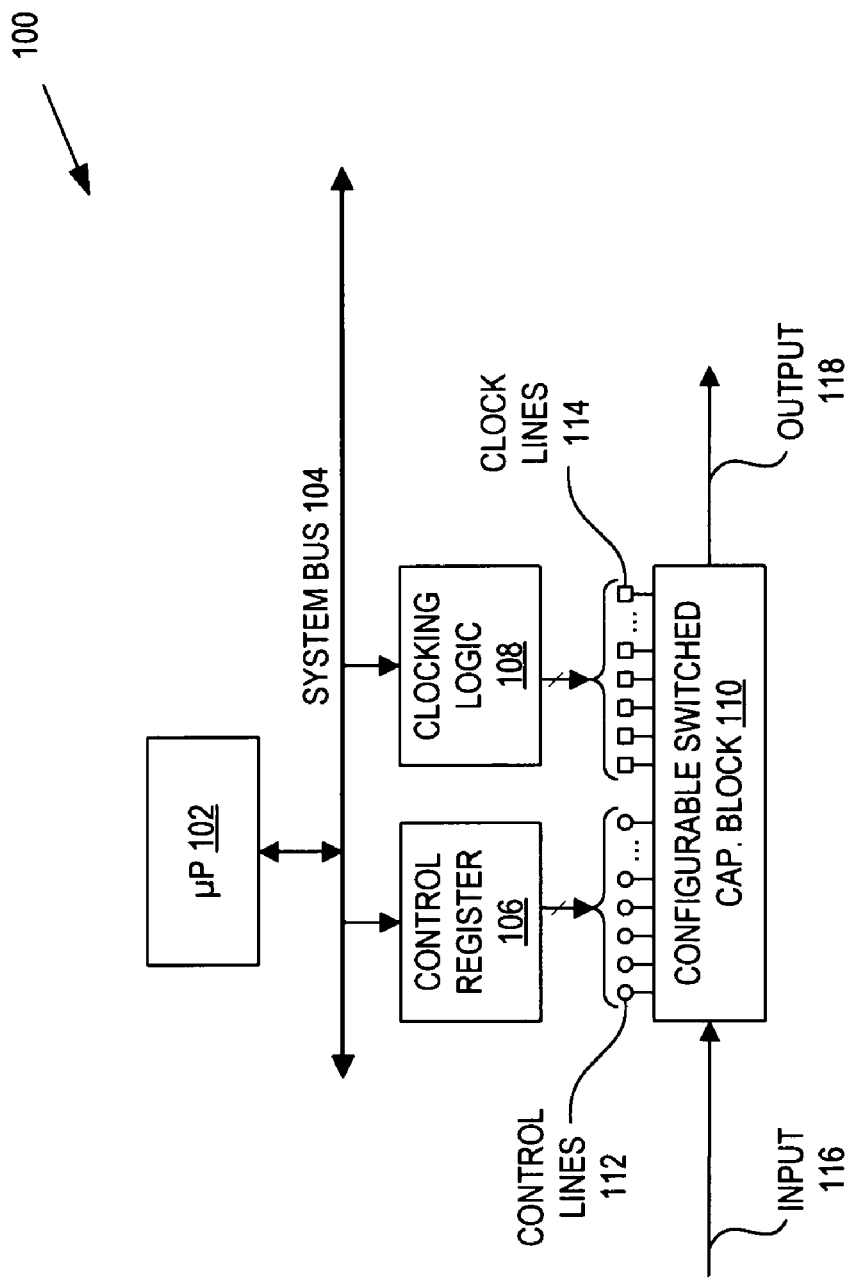
FIG. 1 is a functional block diagram illustrating a system with a configurable switched capacitor block, in accordance with an embodiment of the invention.

FIG. 1 is a functional block diagram illustrating a system 100 with a configurable switched capacitor block 110, in accordance with an embodiment of the invention. The illustrated embodiment of system 100 includes a microprocessor 102 coupled to a system bus 104. Also coupled to system bus 104 are a control register 106 and a clocking logic 108. System 100 also includes configurable switched capacitor block 110 with control lines 110 coupled to control register 106 and clock lines 114 coupled to clocking logic 108.

In the illustrated embodiment, configurable switched capacitor block 110 is coupled to receive an input 116, perform an analog function on input 116, and generate an output 118. Switched capacitor block 110 is configurable between multiple analog functions, such as an amplifier function, an integrator function, a comparator function, a modulator function, a variable gain amplifier function, a variable gain integrator function, a variable gain comparator function, and a variable gain modulator function, etc.

In one embodiment, configurable switched capacitor block 110 includes a plurality of switched capacitors. In this embodiment, the switched capacitors are alternately enabled then disabled by clocking logic 108 via clocking lines 114. The switched capacitors may also include one or more variable capacitors, having a variety of possible capacitance values. In this embodiment, the capacitance of these variable capacitors is controlled by control register 106 via control lines 112. Control register 106 can include a multi-bit control register coupled to microprocessor 102. In one embodiment, control register 106 includes a register having logic elements such as, gates, flip-flops, and the like. By selectively setting control register 106 and clocking logic 108, microprocessor 102 can dynamically reconfigure switched capacitor block 110 in real-time during operation to perform a plurality of analog functions such as, amplification, comparison, integration, and modulation.

Figure 2:
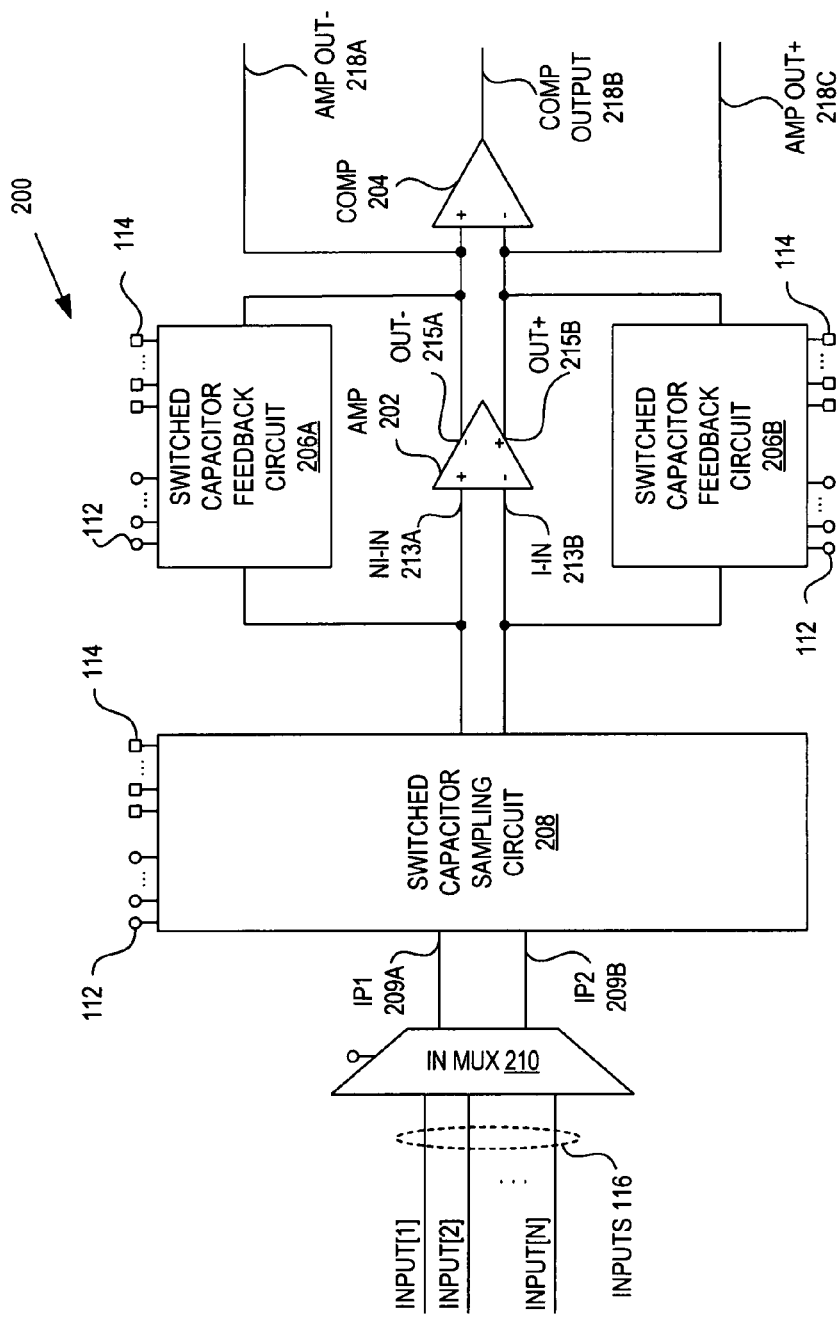
FIG. 2 is a functional block diagram illustrating a configurable switched capacitor block, in accordance with an embodiment of the invention.

FIG. 2 is a functional block diagram illustrating a configurable switched capacitor block 200, in accordance with an embodiment of the invention. Configurable switched capacitor block 200 represents one possible implementation of configurable switched capacitor block 110. In the illustrated embodiment, capacitor block 200 includes an amplifier 202, a comparator 204, switched capacitor (SC) feedback circuits 206a and 206b, an SC sampling circuit 208, input ports 209a and 209b, and an input multiplexer (MUX) 210.

In the illustrated embodiment, amplifier 202 includes differential inputs (e.g., non-inverting input 213a and inverting input 213b) and differential outputs (e.g., negative output terminal 215a and positive output terminal 215b). In one embodiment, amplifier 202 includes an operational transconductance amplifier (OTA) for producing a differential output current in response to a differential input voltage.

In the illustrated embodiment, the inputs of comparator 204 are coupled to negative and positive output terminals 215a and 215a. In one embodiment, comparator 204 operates in an open-loop mode to generate comparator output 218b based on a comparison of the signals at output terminals 215A and 215B.

In the illustrated embodiment, SC feedback circuits 206a and 206b are coupled to selectively control the feedback of amplifier 202. As shown in FIG. 2, SC feedback circuit 206a is coupled between non-inverting input 213a and negative output terminal 215a, and SC feedback circuit 206b is shown as coupled between inverting input 213b and positive output terminal 215b. In one embodiment, SC feedback circuits 206a and 206b are controlled by control register 106 and clocking logic 108 via control lines 112 and clock lines 114, respectively. SC feedback circuits 206a and 206b can include one or more switched capacitors, which can be alternately enabled and disabled by clocking logic 108 at a controlled frequency. Alternately enabling and disabling the switching capacitors can simulate the behavior of a resistor to provide selective feedback for amplifier 202. In one embodiment, SC feedback circuits 206a and 206b include variable capacitors having a programmable capacitance value set by control register 106. SC feedback circuits 206a and 206b may also include a shunting switch to couple at least one of the differential inputs (e.g., 213a or 213b) to at least one of the differential outputs (e.g., 215a or 215b). Although FIG. 2 illustrates two SC feedback circuits 206a and 206b, it is recognized that one or more SC feedback circuits may be included with an embodiment of configurable switched capacitor block 200.

In the illustrated embodiment, switched capacitor (SC) sampling circuit 208 is coupled between the input ports (e.g, 209a and 209b) and the differential inputs of amplifier 202. In one embodiment, SC sampling circuit receives a differential signal at input ports 209a and 209b. In the illustrated embodiment, SC sampling circuit is configurable to selectively sample any of the signals present at the input ports to provide a sampled signal at the differential inputs of amplifier 202. In one embodiment, SC sampling circuit 208 is controlled by control register 106 and clocking logic 108 via control lines 112 and clock lines 114, respectively. SC sampling circuit 208 can include one or more switched capacitors, which can be alternately enabled and disabled by clocking logic 108 at a controlled frequency. SC sampling circuit 208 can also include one or more variable capacitors having a programmable capacitance value set by control register 106.

In the illustrated embodiment, input multiplexer (MUX) 210 is coupled to simultaneously multiplex any of inputs 116 to either of input ports 209a or 209b. For example, input MUX 210 can be configured to couple input[1] to input port 209b, while simultaneously coupling input[n] to input port 209a. In one embodiment, input MUX is controlled by control register 106 via control lines 112. Although FIG. 2 only shows one control line 112 coupled to input MUX 210, it is recognized that input MUX 210 can include one or more control lines 112, dependent, in part, on the number of inputs 116.

Figure 3:
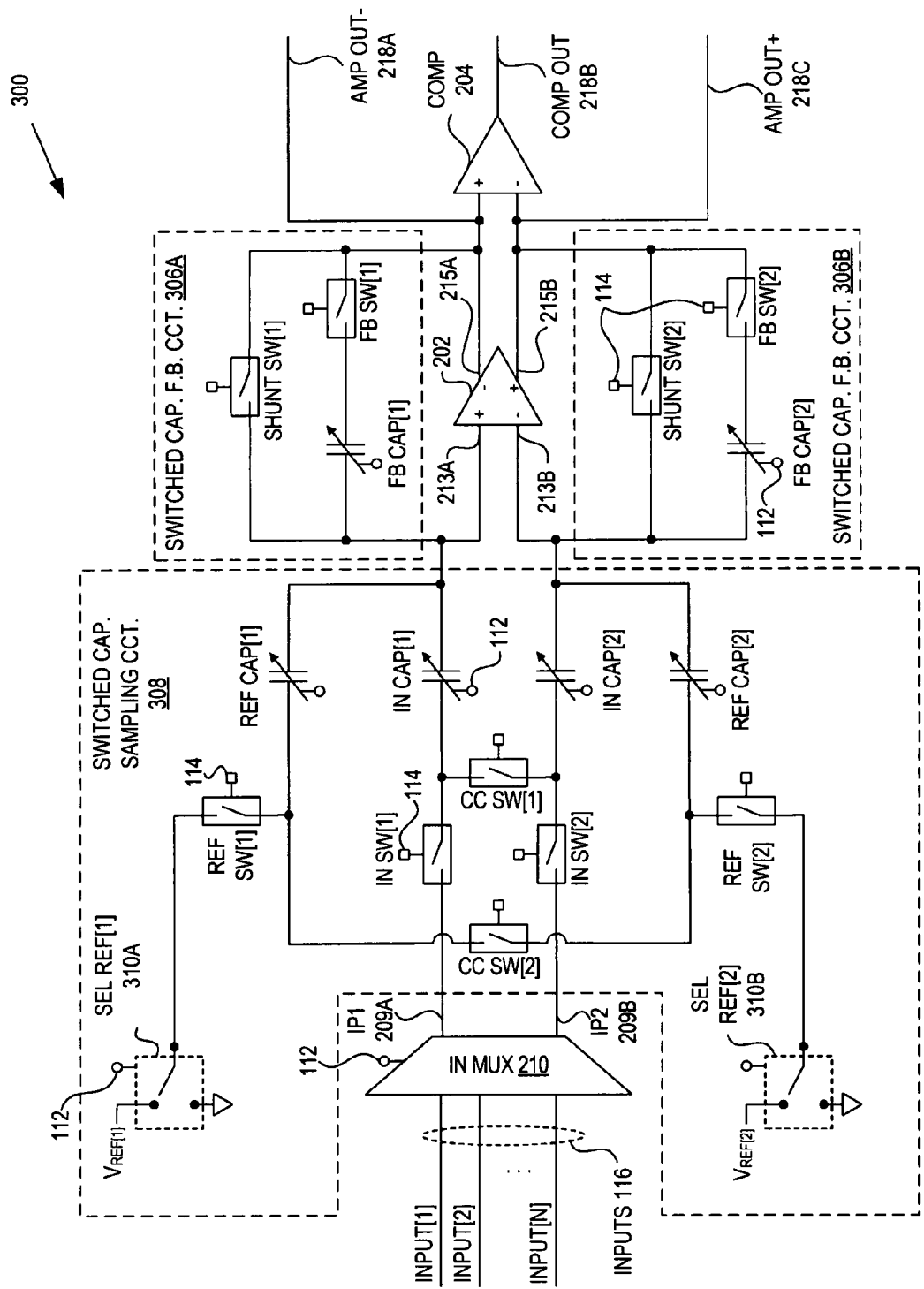
FIG. 3 is a circuit diagram illustrating a configurable switched capacitor block, in accordance with an embodiment of the invention.

FIG. 3 is a circuit diagram illustrating a configurable switched capacitor block 300, in accordance with an embodiment of the invention. Configurable switched capacitor block 300 represents one possible implementation of configurable switched capacitor blocks 110 and 200. In the illustrated embodiment, capacitor block 300 includes amplifier 202, comparator 204, input MUX 210, switched capacitor (SC) feedback circuits 306a and 306b, and a SC sampling circuit 308. The illustrated embodiment of SC feedback circuits 306a and 306b include shunt switches (e.g., SHUNT SW[1] and SHUNT SW[2]), feedback variable capacitors (e.g., FB CAP[1] and FB CAP[2]), and feedback switches (e.g., FB SW[1] and FB SW[2]). The illustrated embodiment of SC sampling circuit 308 includes input switches (e.g., IN SW[1] and IN SW[2]), input variable capacitors (e.g., IN CAP[1] and IN CAP[2]), reference switches (e.g., REF SW[1] and REF SW[2]), reference variable capacitors (e.g., REF CAP[1] and REF CAP[2]), cross-couple switches (e.g., CC SW[1] and CC SW[2]), and selectable voltage references 310a and 310b.

In the illustrated embodiment, FB CAP[1] and FB SW[1] are coupled in series between non-inverting input 213a and negative output terminal 215a to feedback a portion of amplifier 202's negative output back to non-inverting input 213a. FB SW[1] can be coupled to clocking logic 108 to selectively enable and disable FB CAP[1] (i.e., close and open FB SW[1]). By alternately enabling and disabling FB CAP[1] at a frequency controlled by clocking logic 108, FB CAP[1] can simulate the behavior of a resistor to provide selective feedback for amplifier 202. FB CAP[1] can also include a variable capacitance that is programmable by control register 106 via control line 112. Although FB CAP[1] is shown in FIG. 3 as only including one control line 112, any number of control lines 112 may be coupled to control FB CAP[1], dependent, in part, on the number of discrete capacitance values of FB CAP[1]. In one embodiment, clocking logic 108 is programmed to keep FB SW[1] closed and the capacitance of FB CAP[1] is programmed by control register 106 to provide an integrating function of switched capacitor block 300.

In the illustrated embodiment, SHUNT SW[1] is coupled in parallel with FB CAP[1] and FB SW[1] between non-inverting input 213a and negative output terminal 215a. In one embodiment, clocking logic 108 is programmed to keep SHUNT SW[1] closed to couple non-inverting input 213a to the negative output terminal 215a.

The illustrated embodiment also includes FB CAP[2] and FB SW[2] coupled in series between inverting input 213b and positive output terminal 215b. FB CAP[2] and FB SW[2] operate in a similar manner as that of FB CAP[1] and FB SW[1] to feedback a portion of amplifier 202's positive output back to inverting input 213b. Also included in the illustrated embodiment is SHUNT SW[2] configured to selectively couple inverting input 213b to positive output terminal 215b. In one embodiment, clocking logic 108 is configured to close both SHUNT SW[1] and SHUNT SW[2] to effectively bypass amplifier 202 to provide a comparator function of switched capacitor block 300.

In the illustrated embodiment, IN SW[1] and IN CAP[1] are coupled in series between input port 209a and non-inverting input 213a. In one embodiment, IN CAP[1] is alternately enable and disabled (e.g., by closing and opening IN SW[1]) at a frequency controlled by clocking logic 108, such that IN CAP[1] simulates the behavior of a resistor to provide an input resistance to non-inverting input 213a of amplifier 202.

IN CAP[1] can also include a variable capacitance that is programmable by control register 106 via control line 112.

The illustrated embodiment also includes IN CAP[2] and IN SW[2] coupled in series between input port 209b and inverting input 213b. IN CAP[2] and IN SW[2] operate in a similar manner as that of IN CAP[1] and IN SW[1] to provide, in one embodiment, an effective resistance to inverting input 213b of amplifier 202.

As shown in the illustrated embodiment, CC SW[1] is coupled between IN CAP[1] and IN CAP[2]. In one embodiment, clocking logic 108 is programmed to close CC SW[1] to selectively couple IN CAP [1] to IN CAP[2] to provide an input common mode signal used in a charge transfer mechanism from the input variable capacitors (e.g., IN CAP[1] or IN CAP[2]) to the feedback variable capacitors (e.g., FB CAP[1] or FB CAP[2]).

The illustrated embodiment also includes REF SW[ ] and REF CAP[1] coupled in series between selectable voltage reference 310a and non-inverting input 213a. As with the input capacitors and feedback capacitors, REF CAP[1] includes a variable capacitance programmable by control register 106 and can also be alternately enabled and disabled via clocking logic 108 and REF SW[1] to provide an effective resistance between selectable voltage reference 310a and non-inverting input 213a.

In the illustrated embodiment, REF CAP[2] and REF SW[2] are coupled in series between selectable voltage reference 310b and inverting input 213b. REF CAP[2] and REF SW[2] operate in a similar manner as that of REF CAP[1] and REF SW[1] to provide, in one embodiment, an effective resistance between selectable voltage reference 310b and inverting input 213b of amplifier 202.

In the illustrated embodiment, selectable voltage references 310a and 310b are controlled by control register 106 via control line 112 to selectively switch between two voltage references (e.g., Vref[1] and ground). In one embodiment, configurable switched capacitor block 300 can be incorporated into a sigma-delta analog-to-digital converter (ADC) having a 1-bit digital-to-analog converter (DAC) for error correction. In this embodiment, selectable voltage reference 310a and 310b are selectively switched by control register 106 in response to the output of the 1-bit DAC (shown infra). For example, in response to a "HIGH" output from the 1-bit DAC, control register 106 can program selectable voltage reference 310a to switch to Vref[1], while simultaneously programming selectable voltage reference 310b to switch to ground.

As shown in the illustrated embodiment, CC SW[2] is coupled between REF CAP[1] and REF CAP[2]. In one embodiment, clocking logic 108 is programmed to close CC SW[2] to selectively couple REF CAP [1] to REF CAP[2] to provide a reference common mode signal used in a charge transfer mechanism from the reference variable capacitors (e.g., REF CAP[1] or REF CAP[2]) to the feedback variable capacitors (e.g., FB CAP[1] or FB CAP[2]).

Figure 4:
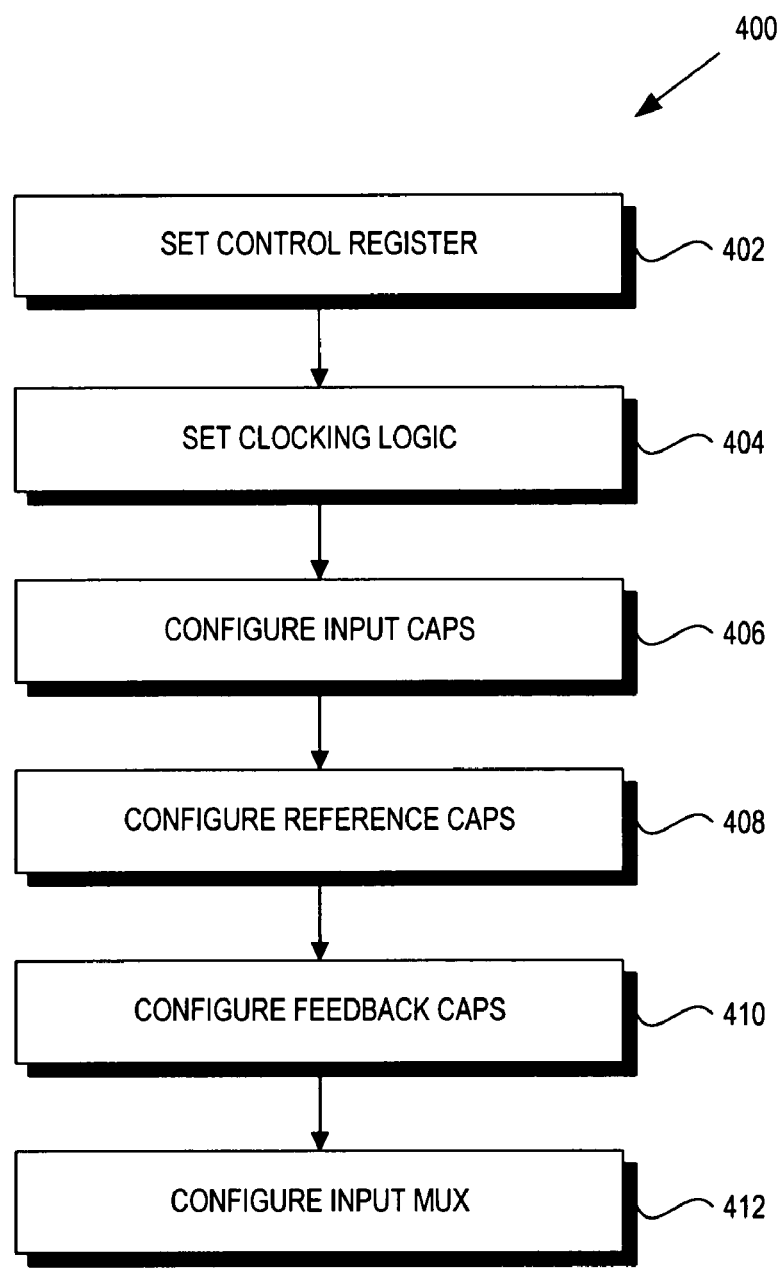
FIG. 4 is a flow chart illustrating a process for configuring a configurable switched capacitor block, in accordance with an embodiment of the invention.

FIG. 4 is a flow chart illustrating a process 400 for configuring a configurable switched capacitor block, in accordance with an embodiment of the invention. In some embodiments, process 400 is executed by any of configurable switched capacitor blocks 110, 200, and 300. Process 400 is described with reference to FIGS. 1, 3 and 4. The order in which some or all of the process blocks appear in process 400 should not be deemed limiting. Rather, one of ordinary skill in the art having the benefit of the present disclosure will understand that some of the process blocks may be executed in a variety of orders not illustrated.

In a process block 402, control register 106 is set and in a process block 404, clocking logic 108 is set. In one embodiment, control register 106 and clocking logic 108 are set by microprocessor 102 via system bus 104. Next, in process blocks 406, 408, and 410, input capacitors, reference capacitors, and feedback capacitors are configured by control register 106 and clocking logic 108. In one embodiment, configuring any of the capacitors includes setting a variable capacitance value of the capacitor via control lines 112. In one embodiment, configuring any of the capacitors includes alternately enabling and disabling the capacitors by closing and opening any of the switches (e.g., input switches, feedback switches, reference switches, etc.) at a controlled frequency.

By selectively setting the capacitance values of FB CAPs, IN CAPs, and REF CAPs, and by selectively setting the switching frequency of the switches, configurable switched capacitor block 300 can be configured to perform a variety of analog functions. For example, configurable switched capacitor block 300 can be configured to perform as a comparator by setting control register 106 and clocking logic 108 to open SHUNT SW[1], SHUNT SW[2], FB SW[1], and FB SW[2], such that amplifier 202 operates in an open-loop mode, where the output of configurable switched capacitor block 300 can be taken at amplifier outputs 218a and 218c.

In another example, configurable switched capacitor block 300 can be configured to perform as an amplifier with variable gain by setting clocking logic 108 and by setting control register 106 to increase or decrease the capacitance of the input variable capacitors (e.g., IN CAP[1] or IN CAP[2]) with respect the capacitance of the feedback variable capacitors (e.g., FB CAP[1] or FB CAP[2]). In this embodiment, the output of configurable switched capacitor block 300 can be taken at amplifier outputs 218a and 218c.

In yet another example, configurable switched capacitor block 300 can be configured to perform as an analog integrator, by setting clocking logic 108 and by setting control register 106 to increase or decrease the capacitance of the input variable capacitors (e.g., IN CAP[1] or IN CAP[2]) with respect the capacitance of the reference variable capacitors (e.g., REF CAP[1] or REF CAP[2]). In this embodiment, the output of configurable switched capacitor block 300 can be taken at any of amplifier outputs 218a, 218c or comparator output 218b.

Figure 5:
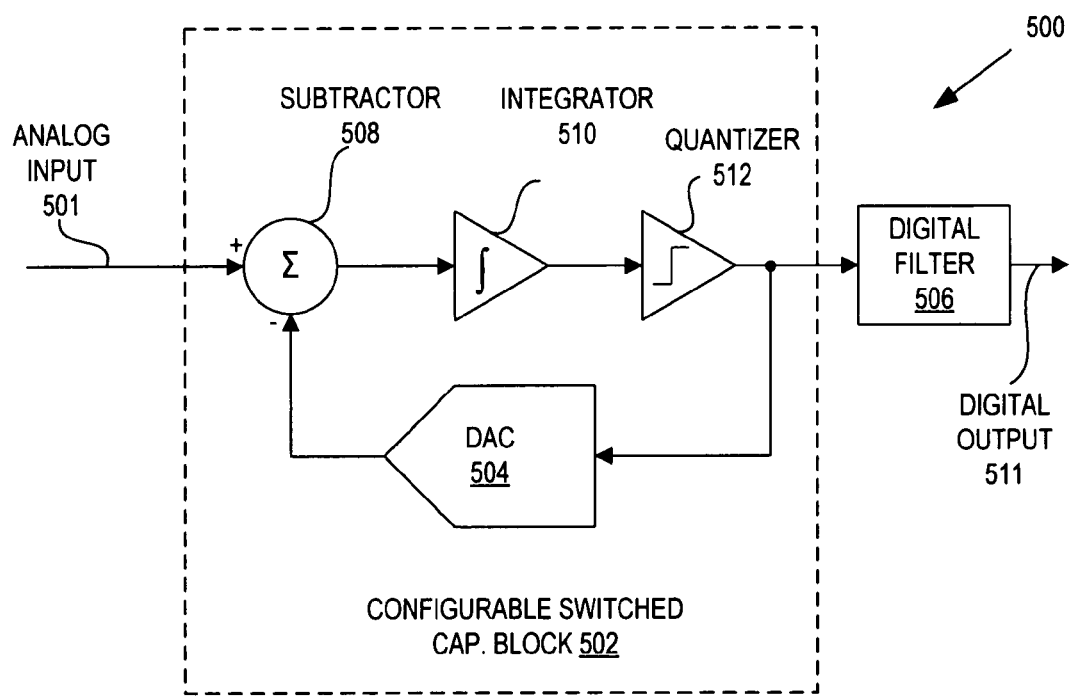
FIG. 5 is a functional block diagram illustrating a first order analog-to-digital converter with a configurable switched capacitor block, in accordance with an embodiment of the invention.

FIG. 5 is a functional block diagram illustrating a first order delta-sigma analog-to-digital converter (ADC) 500, in accordance with an embodiment of the invention. ADC 500 is described with reference to FIGS. 1, 3, and 5. In the illustrated embodiment, ADC 500 includes configurable switched capacitor (SC) block 502 and digital filter 506. Configurable SC block 502 includes embodiments of configurable switched capacitor block 110, 200, or 300 configured to perform various analog functions such as subtractor function 508, integrator function 510, quantizer function 512, and digital-to-analog converter (DAC) function 504.

In the illustrated embodiment, configurable SC block 502 is configured to receive an analog input 501 and perform an analog integrater function 510. In one embodiment, analog integerater function 510 can be performed by selectively setting the capacitance values of the input variable capacitors (e.g., IN CAP[1] or IN CAP[2]) with respect the capacitance of the reference variable capacitors (e.g., REF CAP[1] or REF CAP[2]).

Configurable SC block 502 can also be configured to perform a quantizer function 512 on the output of integrator 510. In one embodiment, quantizing function 512 can be performed by comparator 204 by comparing the output of integrator 510 to a reference voltage.

In the illustrated embodiment, configurable SC block 502 is further configured to perform a DAC function 504. In one embodiment, comparator output 218b is feedback to control register 106 to selectively control the selectable voltage references (e.g., SEL REF 310a and 310b). In this embodiment, SEL REF[1] and SEL REF[2] can act as a one-bit digital to analog converter to provide error correction to subtractor function 508. Subtractor function 508 subtracts the output of DAC function 504 from analog input 501. In one embodiment, subtractor function 508 can be performed by SC sampling circuit 308 by alternately sampling between the selectable voltage references (e.g., SEL REF[1] and SEL REF[2]) and input ports 209a and 209b.

As show in FIG. 5, the output of configurable SC block 502 can be feed to digital filter 506. In one embodiment, digital filter 506 includes a decimation filter to filter the output of configurable SC block 502 to a band of interest. Digital filter 506 may also increase the frequency of the output of configurable SC block 502 to increase the resolution of delta sigma ADC 500.

Including configurable switched capacitor block 502 into delta sigma ADC 500 allows dynamic changes in functionality of a particular architecture or may allow the reuse of switched capacitor block 502 into different portions of a particular circuit design. For example, configurable SC block 502 may be reconfigured and included with another portion of a circuit to provide an amplifier function, an integrator function, a modulator function, a comparator function, etc. In yet another example, a second configurable SC block may be selectively coupled to delta sigma ADC 500 and configured to provide additional orders of analog integration.

Figure 6:
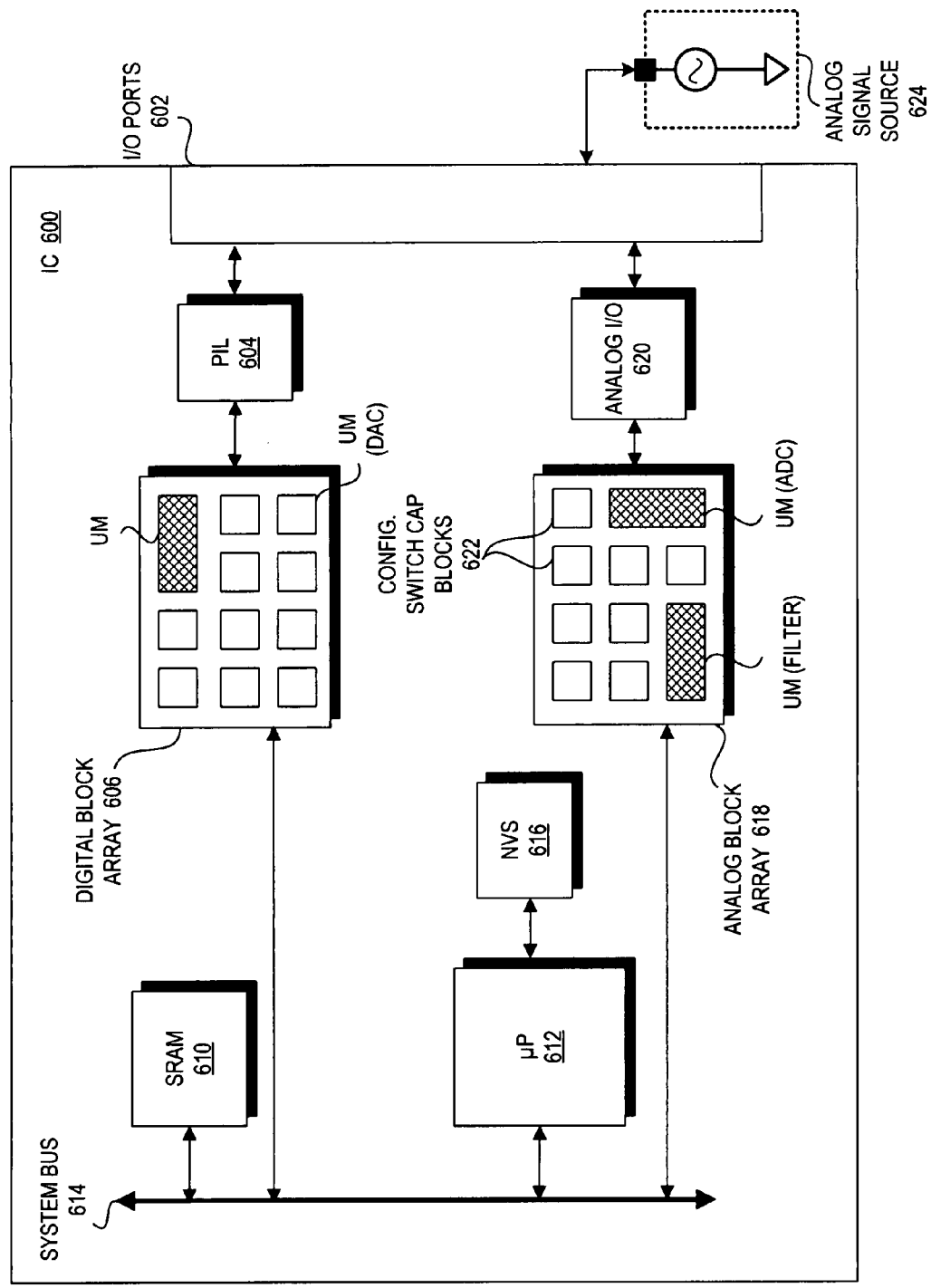
FIG. 6 illustrates a demonstrative integrated circuit for implementing an embodiment of the invention.

FIG. 6 illustrates a demonstrative integrated circuit ("IC") 600 implemented using an embodiment of configurable switched capacitor block 110, 200, or 300. IC 600 may include a Programmable System on a Chip (PSoC™) microcontroller by Cypress Semiconductor Corporation. The illustrated embodiment of IC 600 includes input/output ("I/O") ports 602. I/O ports 602 are coupled to Programmable Interconnect and Logic ("PIL") 604 which acts as an interconnect between I/O ports 602 and a digital block array 606. Digital block array 606 may be configured to implement a variety of digital logic circuits (e.g., DAC, digital filters, digital control systems, etc.) using configurable user modules ("UMs"). Digital block array 606 is further coupled to a system bus 614.

Static Random Access Memory ("SRAM") 610 and microprocessor 612 are also coupled to system bus 614. Microprocessor 612 is coupled to non-volatile storage ("NVS") 616 which may be used to store firmware (e.g., control algorithms executable by microprocessor 102 to implement process 500).

An analog block array 618 is coupled to system bus 614. Analog block array 618 also may be configured to implement a variety of analog circuits (e.g., ADCs, analog filters, comparators, buffers, current sources, etc.) using configurable UMs. Analog block array 618 is also coupled to an analog I/O unit 620 which is coupled to I/O ports 602.

As illustrated, configurable switched capacitor (SC) blocks 622 can be included in analog block array 618 as user modules. In one embodiment, configurable SC blocks 622 include configurable ADC 108, configurable ADC 200, or configurable ADC 300. Configurable SC blocks 622 can be selectively coupled to analog I/O unit 620 for coupling to an external analog signal source 624 via I/O ports 602. In addition, configurable SC blocks 622 can be coupled together or to other UMs included in digital block array 606 or analog block array 618 to perform a variety of analog functions.

The processes explained above are described in terms of computer software and hardware. The techniques described may constitute machine-executable instructions embodied within a machine (e.g., computer) readable medium, that when executed by a machine will cause the machine to perform the operations described. Additionally, the processes may be embodied within hardware, such as an application specific integrated circuit ("ASIC") or the like.

As described above, configurable switched capacitor blocks 110, 200, or 300 may be incorporated into IC 600, as well as, various other integrated circuits. Descriptions of configurable switched capacitor blocks 110, 200, or 300 may be generated and compiled for incorporation into other integrated circuits. For example, behavioral level code describing configurable switched capacitor block 300, or portions thereof, may be generated using a hardware descriptive language, such as VHDL or Verilog, and stored to a machine-accessible medium. Furthermore, the behavioral level code can be compiled into register transfer level ("RTL") code, a netlist, or even a circuit layout and stored to a machine-accessible medium. The behavioral level code, the RTL code, the netlist, and the circuit layout all represent various levels of abstraction to describe configurable switched capacitor blocks 110, 200, or 300.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. An apparatus comprising:
a switched-capacitor (SC) sampling circuit configured to receive an input signal and to selectively generate a sampled signal;
an amplifier having differential input and differential outputs, wherein the differential inputs comprise a non-inverting and an inverting input configured to receive the sampled signal, and wherein the SC sampling circuit includes:
a first and a second input port;
a first input capacitor coupled between the input port and the non-inverting input of the amplifier;
a second input capacitor coupled between the second input port and the inverting input of the amplifier; and
a first cross-connect switch to selectively couple the first and second input capacitors together;
an SC feedback circuit coupled between the differential inputs and the differential outputs to selectively control a feedback of the amplifier, wherein the SC feedback circuit comprises a feedback switch and a feedback variable capacitor coupled in series between the differential inputs and the differential outputs of the amplifier; and
a comparator coupled to the differential outputs of the amplifier, wherein the SC sampling circuit and the SC feedback circuit are programmable to select between multiple analog functions of the apparatus;

wherein the multiple analog functions comprises at least two analog functions selected from the group consisting of: an amplifier function, an integrator function, a comparator function, a modulator function, a variable gain amplifier function, a variable gain integrator function, a variable gain comparator function, and a variable gain modulator function.

2. The apparatus of claim 1, wherein the SC feedback circuit comprises a shunting switch coupled in parallel with the feedback switch and the feedback variable capacitor to selectively couple at least one of the differential inputs with at least one of the differential outputs of the amplifier.

3. The apparatus of claim 1, wherein the first input capacitor is a first input variable capacitor and the second input capacitor is a second input variable capacitor, and wherein the SC sampling circuit further comprises:
a first input switch coupled in series with the first input variable capacitor between the first input port and the non-inverting input of the amplifier; and
a second input switch coupled in series with the second input variable capacitor between the second input port and the inverting input of the amplifier.

4. The apparatus of claim 3, wherein the SC sampling circuit further comprises:
a first and a second selectable voltage reference;
a first reference switch and a first reference variable capacitor coupled in series between the first selectable voltage reference and the non-inverting input of the amplifier; and
a second reference switch and a second reference variable capacitor coupled in series between the second selectable voltage reference and the inverting input of the amplifier.

5. The apparatus of claim 4, wherein the SC sampling circuit further comprises:
a second cross-connect switch to selectively couple the first and second reference variable capacitors together.

6. The apparatus of claim 4, further comprising a multi-bit control register coupled to independently control the input multiplexer and a capacitance value of any of the input variable capacitors, the reference variable capacitors, and the feedback variable capacitor.

7. The apparatus of claim 6, further comprising a processor, coupled to set the multi-bit control register to configure the SC feedback circuit and the sampling circuit to select between the multiple analog functions.

8. The apparatus of claim 3, further comprising an input multiplexer coupled between a plurality of input lines and the first and second input ports to selectively couple any of the plurality of input lines to either of the first and second input ports.

9. A method comprising:
setting a control register coupled to a switched-capacitor (SC) block;
configuring an SC feedback circuit of the SC block to selectively control the feedback of an amplifier of the SC block in response to setting the control register;
configuring an SC sampling circuit coupled to receive an input signal and to selectively output a sampled signal to the amplifier in response to setting the control register, wherein configuring the SC feedback circuit and SC sampling circuit includes selecting between multiple analog functions of the SC block, wherein the SC sampling circuit comprises a first and a second input port; and
configuring an input multiplexer to selectively couple any of a plurality of input lines to the first and second input ports.

10. The method of claim 9, wherein the multiple analog functions comprises at least two analog functions selected from the group consisting of: an amplifier function, an integrator function, a comparator function, a modulator function, a variable gain amplifier function, a variable gain integrator function, a variable gain comparator function, and a variable gain modulator function.

11. The method of claim 9, wherein the SC feedback circuit and the SC sampling circuit comprise a plurality of switched capacitors, the method further comprising configuring a clocking logic circuit to alternately enable and disable the plurality of switched capacitors.

12. The method of claim 11, wherein the plurality of switched capacitors comprises a plurality of variable capacitors, wherein configuring the feedback circuit and configuring the SC sampling circuit comprises setting a capacitance value for at least one of the plurality of variable capacitors.

13. A switched capacitor block comprising:
means for receiving an input signal and selectively generating a sampled signal;
means for amplifying the sampled signal, said means for amplifying having differential inputs and differential outputs, wherein the differential inputs are coupled to receive the sampled signal;
means for selectively controlling a feedback of the means for amplifying;
means for comparing the differential output of the means for amplifying;
means for selecting between multiple analog functions of the switched capacitor block;
means for alternately enabling and disabling a plurality of switched variable capacitors; and
means for setting a capacitance value for at least one of the plurality of switched variable capacitors.

14. The switched capacitor block of claim 13, wherein the multiple analog functions comprises at least two analog functions selected from the group consisting of: an amplifier function, an integrator function, a comparator function, a modulator function, a variable gain amplifier function, a variable gain integrator function, a variable gain comparator function, and a variable gain modulator function.

* * * * *